United States Patent [19]

Schueler et al.

[11] Patent Number: 5,397,890
[45] Date of Patent: Mar. 14, 1995

[54] NON-CONTACT SWITCH FOR DETECTING THE PRESENCE OF OPERATOR ON POWER MACHINERY

[76] Inventors: Robert A. Schueler, 1090 Emerson Dr., Oconomowoc, Wis. 53066; Stuart J. Schueler, 7309 Meadow Valley Rd., Middleton, Wis. 53562

[21] Appl. No.: 190,248

[22] Filed: Feb. 1, 1994

Related U.S. Application Data

[63] Continuation of Ser. No. 813,285, Dec. 20, 1991, abandoned.

[51] Int. Cl.⁶ .............................................. G01V 9/04
[52] U.S. Cl. .................................... 250/221; 180/272
[58] Field of Search ............................ 250/221, 222.1; 191/1 R; 180/167, 168, 271, 272, 315, 335

[56] References Cited

U.S. PATENT DOCUMENTS

| | | | |
|---|---|---|---|
| 4,029,957 | 6/1977 | Betz et al. | 250/221 |
| 4,210,905 | 7/1980 | Coons | 180/272 |
| 4,281,734 | 8/1981 | Johnston | 250/221 |
| 4,868,912 | 9/1989 | Doering | 340/706 |
| 4,941,854 | 7/1990 | Takahashi et al. | 180/272 |
| 4,972,070 | 11/1990 | Laverty | 250/221 |
| 4,973,834 | 11/1990 | Kim | 250/221 |
| 4,973,837 | 11/1990 | Bradbeer | 250/221 |
| 5,103,085 | 4/1992 | Zimmerman | 250/221 |
| 5,138,150 | 8/1992 | Duncan | 250/221 |

*Primary Examiner*—David C. Nelms
*Attorney, Agent, or Firm*—Andrus, Sceales, Starke & Sawall

[57] ABSTRACT

A non-contact operator present engine cut-off switch includes an emitter for directing a radiated signal away from a control handle on power machinery and a detector positioned to receive the radiated, reflected signal from the hand of an operator in order to detect the operator presence in an operating zone to permit operation of the power machinery. The non-contact sensing circuitry may be hermetically sealed to protect the circuitry from adverse environmental conditions.

17 Claims, 2 Drawing Sheets

NON-CONTACT SWITCH FOR DETECTING THE PRESENCE OF OPERATOR ON POWER MACHINERY

This application is a continuation application Ser. No. 07/813,285 filed Dec. 20, 1991, now abandoned.

BACKGROUND OF THE INVENTION

1. Field of the Invention

The subject invention is generally directed to engine cut-off switches for use with power machinery and is specifically directed to a non-contact device for determining the presence of an operator on power machinery.

2. Description of the Prior Art

Power machinery such as snowmobiles, snowblowers, lawnmowers, all terrain vehicles, personal watercraft and the like generally include engine cut-off devices for shutting the engine off if the power take-off is active and the operator becomes separated from the machinery. Many of the prior art systems have included levers which activate a spring loaded mechanical switch or a tether cord which is interfaced into a mechanical switch or key lock. The levers, which the operator must hold down or squeeze at all times during operation, are often uncomfortable, difficult to use and can cause operator fatigue. The tether cord is very restrictive and limits the range of motion of the operator. Both types of prior art devices use a mechanical switch which can become unreliable under certain environmental conditions.

It is also known to rely on optical sensors to determine the presence of personnel or activity in the vicinity of certain types of equipment such as water faucets, lavatories and the like, wherein a non-contact sensor determines the presence of the personnel within a certain operating zone to either activate or de-activate the system.

U.S. Pat. No. 3,621,268, entitled: Reflection Type Contactless Touch Switch Having Housing With Light Entrance And Exit Apertures Opposite And Facing, issued to K. Friedrich, et al on Nov. 16, 1971 discloses the principle of applying light to a portion of the hand of an operator, wherein the light is reflected off the hand to a receiver.

U.S. Pat. No. 4,282,430, entitled: Reflection-Type Photoelectric Switching Apparatus, issued to H. Hatten et al on Aug. 4, 1981 discloses a reflection-type photoelectric switching apparatus having means for adjusting the optical axis of at least one light projecting and one receiving device.

U.S. Pat. No. 4,294,263, entitled: System For Detecting Probe Dislodgement, issued to B. Hochman on Oct. 13, 1981 discloses a system for detecting a probe dislodgement wherein radiation is reflected from a body and impinges on a collector when the contact surface is in contact with the body.

U.S. Pat. No. 4,295,475, entitled: Probe And System For Detecting Probe Dislodgement, issued to T. Torzala on Oct. 20, 1981 discloses a system similar to that shown and described in U.S. Pat. No. 4,294,263.

U.S. Pat. No. 4,520,262, entitled: Photoelectric Safety Screen With Stray Source Detection, issued to A. Denton on May 28, 1985 discloses a photoelectric screen for detecting the presence of an operator in the operating zone of industrial machinery such as large industrial presses, guillotines and the like.

U.S. Pat. No. 4,727,593, entitled: Passive Line-Of-Sight Optical Switching Apparatus, issued to P. Goldstein on Feb. 23, 1988 discloses a line-of-sight optical communications device adapted to pick up movement in a protected zone or region for activating an alarm system or the like.

U.S. Pat. No. 4,767,922, entitled: Hand Presence Activated Water Faucet Controller, issued to N. Stauffer on Aug. 30, 1988 discloses a contactless system for determining the presence of hands under a faucet to activate the flow of water only during the period of time when the hands are present in the operating zone.

U.S. Pat. No. 4,814,600, entitled: Electromagnetic Radiation Circuit Element issued to A. Bergstrom on Mar. 21, 1989 discloses an electromagnetic circuit adapted for monitoring and reacting to an identifiable change in the radiation pattern reaching the output device from an input device when the surface of the fiber optic screen is touched.

U.S. Pat. No. 4,868,912, entitled: Infrared Touch Panel issued to R. Doering on Sep. 19, 1989 discloses a touch panel system having a display surface including a plurality of light emitting elements that define a grid of intersecting light pads. A specific touch pattern is detected for activating the system.

U.S. Pat. No. 4,878,107, entitled: Touch Sensitive Indicating Light, issued to W. Hopper on Oct. 31, 1989 discloses a device using a touch sensitive light emitting diode encapsulated in a plastic dome and an externally operable touch sensitive switching means such as a resistive touch switch or the like.

U.S. Pat. No. 4,879,461, entitled: Energy Field Sensor Using Summing Means, issued to H. Philipp on Nov. 7, 1989 discloses an energy field sensor including a digital to analog converter device wherein the digital processing circuitry modulates the amplitude to create a null condition when a certain range of signals are present.

U.S. Pat. No. 4,888,532, entitled: Object Sensing Apparatus, issued to B. Josson on Dec. 19, 1989 discloses an object sensing apparatus having a plurality of light emitting diodes for illuminating a region of space and the plurality of closely arranged detectors for receiving the reflected light for use, in particular, with automatic doors and the like.

U.S. Pat. No. 4,939,358, entitled: Switch Apparatus Including A Pair Of Beam-Type Switches, issued to J. Herman et al on Jul. 3, 1990 discloses a switch apparatus including an infrared emitter and an infrared receiver with a relay which is actuated upon breaking of the infrared beam between the emitter and receiver by placing an operator's fingers in the sensing zone.

SUMMARY OF THE INVENTION

None of the prior art discloses an engine cut-off switch for operating power machinery such as snowmobiles, snowblowers, lawnmowers, all terrain vehicles, personal watercraft and the like wherein a non-contact sensing device is utilized to actuate a system for activating the circuit permitting the engine to run on the device when the operator's hands are in an operating zone defined by the sensors. The present invention overcomes many of the difficulties of the prior art mechanical devices by incorporating a touchless sensing system which requires no force or physical contact to operate the power machinery. Because the apparatus is solid state, its reliability and resistance to weather conditions is excellent. In the preferred embodiment of the subject invention, the device includes an emitter and a detector wherein a modulated and synchronized beam of radiation is directed away from the control handle toward the hand of the operator and is reflected back to the detector for activating a solid state switch. The switch is integrated with the machinery ignition circuitry, wherein removal of the operator's hands from the reflective range of the apparatus causes the switch to ground the ignition, thereby stopping the engine and prohibiting operation of the power machinery.

The engine cut-off switching circuitry of the subject invention is adapted for sensing the presence of the hands of an operator in the proximity of an operating zone without requiring actual contact between the operator and any portion of the machinery. The circuit includes a sensor connected to a power supply for activating the switch circuitry, the switch being operable to cut off the power to the machinery when the hands of the operator are withdrawn from or removed from the operating zone. An emitter is mounted on the machinery handle and is adapted for emitting a signal from the machinery handle into an operating zone where the operator's hands are to be positioned during operation of the machinery. The emitted signal is adapted to be reflected by the operator's hands when the hands are properly positioned in the operating zone. A detector is connected to the emitter to provide a modulated pulse to the emitter and to detect the reflected signal from the emitter. The detected signal is directed to control means which is responsive to the presence-of the reflected signal for permitting operation of the power machinery and is responsive to the lack of the reflected signal for de-activating or shutting down the power machinery.

In the preferred embodiment of the invention, the switching circuitry is connected in series between the condenser coil of the internal combustion engine and ground. When the operator's hands are removed from the operating zone, the switching circuitry grounds the engine coil, shutting down the engine.

It is, therefore, an object and feature of the subject invention to provide for an engine cut-off circuit and control device for power machinery for sensing the presence of an operator's hands in an operating zone without requiring physical contact between the operator and the power machinery.

It is another object and feature of the subject invention to provide for a detection circuit which is impervious to weather conditions and environmental factors, providing a reliable engine cut-off system for use in power machinery operated under adverse conditions.

It is yet another object and feature of the subject invention to provide for an engine cut-off circuit which is not dependent upon mechanical switching elements for activating and de-activating power machinery in response to the presence of an operator.

Other objects and features of the invention will be readily apparent from the accompanying drawings and description of the preferred embodiment.

BRIEF DESCRIPTION OF THE DRAWINGS

The drawings illustrate the best mode presently contemplated of carrying out the invention, wherein.

DETAILED DESCRIPTION OF THE PREFERRED EMBODIMENT

Figure 1:
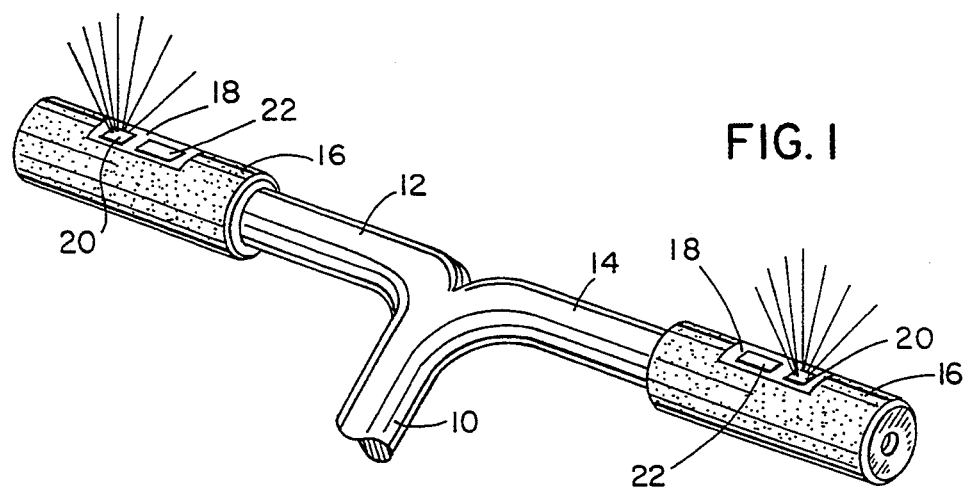
FIG. 1 is a fragmentary perspective view of the control handle of typical power machinery including the contactless sensing elements of the subject invention.

As shown in FIG. 1, typical power machinery includes a handle 10 having a pair of hand grips 12 and 14 each including a grip member 16 having a sensor window 18 incorporating the emitter 20 and detector 22 of the subject invention. It will be readily understood that the handle 10 is representative of the hand grip portion of any of a number of power machinery devices such as, by way of example, snowmobiles, snowblowers, lawnmowers, all terrain vehicles, personal watercraft and the like. The particular configuration of the handle 10 is not a significant part of the invention and the detector circuitry incorporated in the window 18 may be used in a unitary system operated by the presence of a single hand or in a dual system wherein both hands have to be placed in the vicinity of individual hand grips, as shown in FIG. 1.

Figure 2:
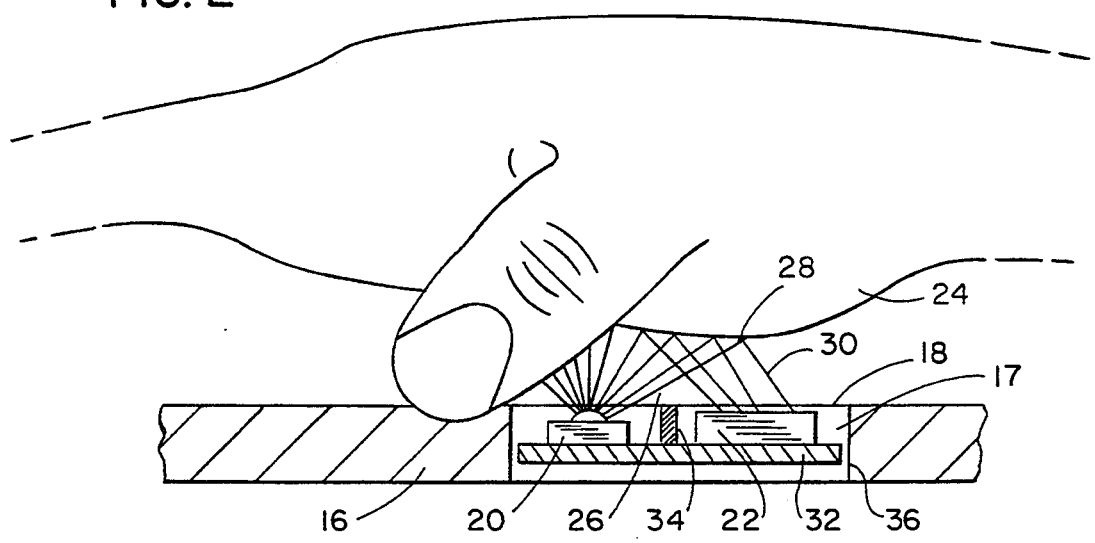
FIG. 2 is a view, partially in section, showing the emitter and detector elements of the subject invention as incorporated in the handle illustrated in FIG. 1.

As is best shown in FIG. 2, when the emitter 20 is powered, it emits an optical signal as indicated by the emitted beam 26. When the operator places his hand 24 in the vicinity of the hand grip 16 and in the zone through which the emitted beam 26 passes, the operator's hand 24 intersects emitted beam 26 and the beam reflects from the hand, as shown at 28, and produces a reflected beam 30 which is picked up by the detector circuitry 22. This detector circuit 22 is then operative to send a signal to the control circuitry for indicating the presence of the operator's hand 24 in the vicinity of the hand grip 16 and in an acceptable operating zone. This permits the power machinery to operate.

In the preferred embodiment of the invention, the emitter 20 and detector 22 are mounted on a printed circuit board 32 with a radiation barrier 34 placed between the emitter and the detector to avoid detection of stray signals. The barrier 34 is made of a radiation impervious material and prevents non-reflected radiation from striking the detector 22. The entire sensing circuit including the emitter 20, detector 22, board 32 and barrier 34 is encased in a material which is capable of transmitting the specific radiation used in the device. The material forms a capsule or shell around the entire sensing circuit and protects the sensing circuitry from adverse environmental conditions. In the preferred embodiment of the subject invention, the capsule comprises a transparent polyester resin which is formed around the detection circuit for defining a shell 17 through which the emitted and reflected beams pass. The capsule or shell 17 is adapted to be received in a suitable aperture 36 provided in the grip member 16 for defining the sensor window 18.

In the preferred embodiment of the invention, the emitter is a light emitting diode (LED) adapted for producing radiation in the infrared range with a wave length of 850-950 nms. The radiation beams 26 produced by the emitter 20 are emitted outwardly toward the hand 24 of the user and then reflected back toward the detector 22 for completing the detection and sensing operation. The detector 22 is a Sharp IS440 optic light detector with a built-in signal processing circuit for light modulation. The detector 22 senses the presence of reflected signals 30 and produces an output signal for operating the operator present circuit 42 (see FIG. 3).

Figure 3:
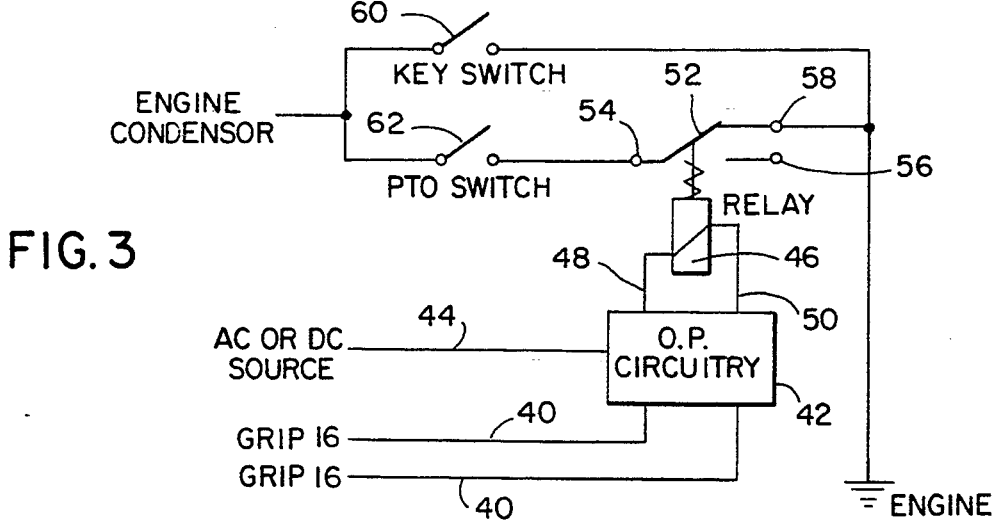
FIG. 3 is a typical electrical circuit diagram for a power supply for power machinery incorporating the operator present circuitry of the subject invention.

As shown in FIG. 3, the electrical connection of the emitter 20 and the detector 22 is indicated by the signal lines 40. It will be understood that in the dual circuit system illustrated in FIG. 1 there are a pair of grip members 16, each of which includes identical circuitry and an identical signal line 40 for providing communication with the operator present circuitry 42. In the preferred embodiment, the ground or LOW side of the light emitting diode emitter 20 is grounded through manufacturer's pin 4 of the Sharp IS440 detector 22. By grounding through the detector 22 with its integrated modulating circuitry,-the emitter will generate a unique light pattern only recognizable by the mated IS440 detector 22. This unique means for generating a radiation signal makes each emitter/detector pair totally isolated. This assures that radiation generated by other emitters is not detectable by any detector other than the complementary mate. This isolation also assures that the switches are unaffected by other sources of radiation such as remote controls, sunlight and incandescent light. This is important because the apparatus may be used in a variety of environments under adverse conditions.

In the preferred embodiment of the invention, the operator present circuitry 42 is powered by an AC or DC power source as indicated by power supply line 44, The AC or DC power source may be provided directly from the engine for operating the power machinery. The operator present circuitry 42 is operable to provide a solid state relay as indicated at 46 via control lines 48 and 50. In the preferred embodiment, the solid state relay 46 is spring loaded to the grounded circuit position, wherein the switch contact 52 is across the circuit contacts 54 and 58. When an operator puts his hand 24 in position of the appropriate grip members 16, signals are present on lines 40 for actuating the operator present circuitry 42 to activate the relay via lines 48 and 50 for overcoming the force of the spring and moving the relay contact 52 to close the circuit between circuit contacts 54 and 56.

m

As is typical in power machinery circuits, the engine condenser is normally actuated by a key switch 60 and a manually controlled power take-off switch 62. The key switch 60 must be open before the engine can operate. The operator present circuitry relay 46 is positioned in series with the power take-off switch 62 and precludes operation of the engine when the operator's hand is not in the operating zone as defined by the sensing circuit comprising the emitter 20 and the detector 22.

Figure 4:
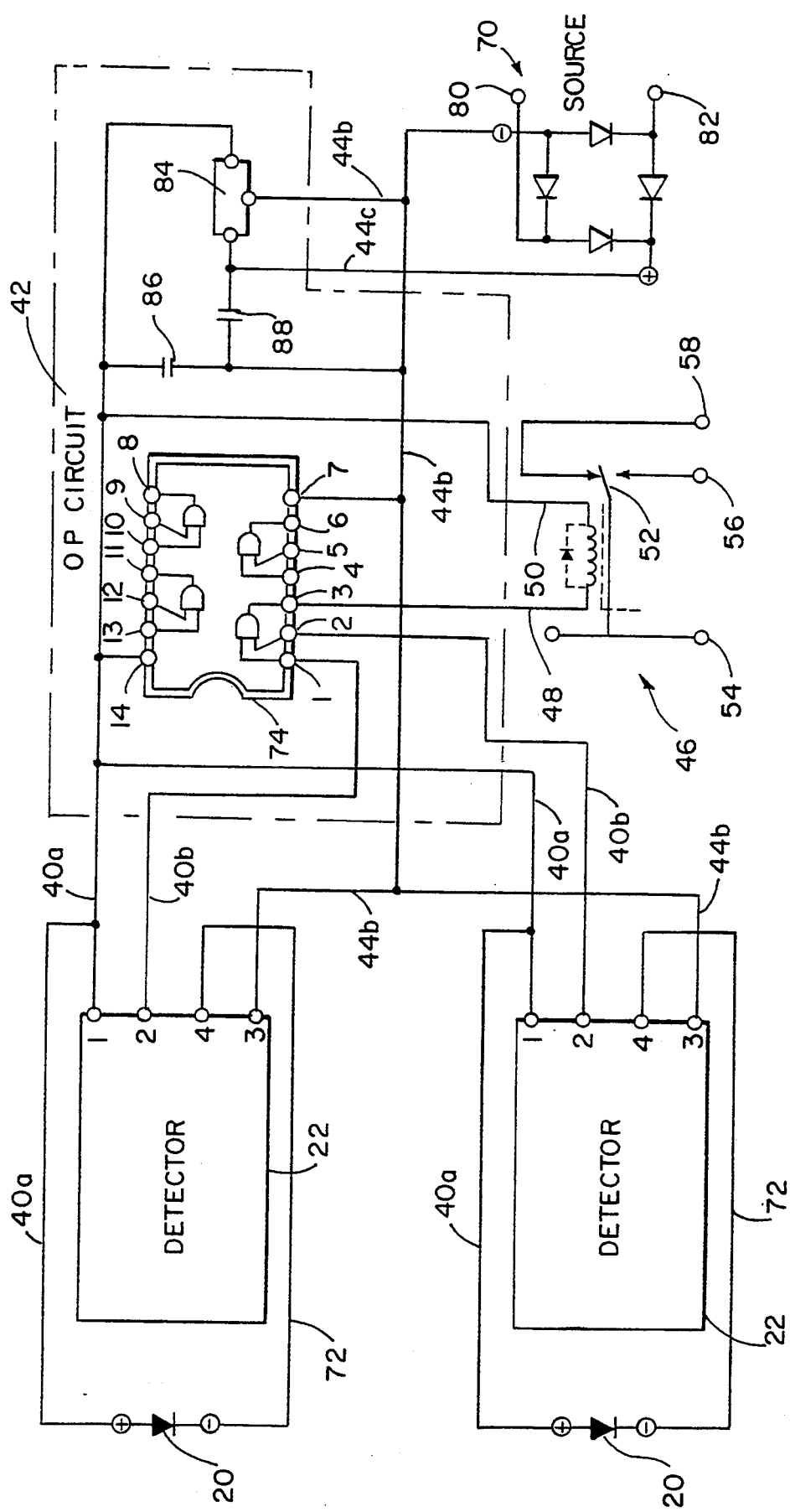
FIG. 4 is a schematic diagram of the operator present circuitry illustrated in FIG. 3.

A detailed schematic circuit diagram for the sensing element and the operator present circuit 42 is shown in FIG. 4. In the preferred embodiment, the Sharp IS440 detector 22 circuits are connected, using the manufacturer's pin numbers, as follows: Pin 1 is connected to the positive side of the emitter 20 via line 40a and to the output side of the voltage regulator 84. Pin 2 of each detector 22 is connected to the gate array 74 via line 40b. Pin 3 of each detector 22 is connected via line 44b to the negative side of the rectifier circuit 70. Pin 4 of each detector 22 is connected to the negative side of the respective emitter 20 via line 72.

When a radiated signal 26 is reflected off the palm of the operator's hand, as shown in FIG. 2, it strikes the optical sensor of the respective detector 22. The detector 22 in the preferred embodiment is the Sharp IS440 detector circuit with integrated modulation circuitry and is adapted for processing the signal to determine if it matches the emitted signal from the mated emitter 20 via built-in comparing, synchronizing, and demodulating circuits. If the reflected radiation 30 picked up by the detector circuit 22 is determined to be from the appropriate emitter 20, the voltage at pin 2 of that detector changes from a HIGH state to a LOW state. Each terminal 2 from each detector circuit 22 is connected to the input terminals or pins 1 and 2 of the quad 2-input AND gate 74 of the operator present circuit 42. All four positive logic AND gates contained within the quad 2-input AND gate 74 may be used independently. This permits as many as eight emitter/detector sets to be connected to the AND gate.

On any one gate when either input is in a LOW state, the output signal present at that gate's output pin is LOW, and in the preferred embodiment line 48 would be LOW. When both signals from the respective pins 2 of the detector circuits 22 are HIGH, the output on line 48 is HIGH. In the preferred embodiment, the unswitched condition of the detector circuits 22 is HIGH which causes the output of the AND gate array 74 to be HIGH on pin 3 and line 48. When radiation is detected, the detectors 22 go LOW and the output of the AND gate goes LOW on line 48.

When the output of the AND gate array 74 is LOW on line 48, there is a potential developed across the coil of the relay 46. This causes the relay to magnetically toggle the relay contact blade 52 from terminal 58 to terminal 56 to open the circuit. This permits the engine to operate for powering the machinery. When the signal on line 48 goes HIGH, the relay potential across the relay 46 is deleted, permitting the switch contact 52 to return to terminal 58. This grounds the condenser coil to the engine block, and stops operation of the engine.

The operator present apparatus is connected between the power take-off switch 62, and the engine block (see FIG. 3). When the operator's hands are in the proper position, the operator present circuitry will toggle the relay, thereby connecting the terminal 54 to the terminal 56, and placing the circuits in an open condition. When the PTO switch 62 (FIG. 3) is closed, the engine will run since the engine condenser coil is connected to an open circuit. As soon as the operator removes his hands, the relay closes the circuit between terminals 54 and 58, grounding the condenser coil to the engine block and shutting off the engine.

The power supply for operating the operator present circuit of the subject invention is an integral part of the circuit shown in FIG. 4. The electrical power generated by the internal combustion engine is used to supply the raw power at terminals 80 and 82. This raw power is conditioned by the bridge rectifier 70 and filter capacitor 88. The raw power may be of the type alternating, direct, or a combination of both. This conditioned signal is regulated by voltage regulator 84 to a positive 5 VDC across lines 40A and 44B.

In the preferred embodiment of the invention, the rectifier circuit is a generic 8244 rectifier, the voltage regulator 84 is a generic 5 volt 7805 regulator and a generic solid state 8920 relay is used for the relay control mechanism 46.

While certain features and embodiments of the invention have been described in detail herein, it will be readily understood that the invention encompasses all modifications and enhancements within the scope and spirit of the following claims.

What is claimed is:

1. A computer-free, filterless engine cut-off switching circuit for controlling power machinery, the circuit adapted for continuously sensing the presence of an operator's hands in the proximity of an operating zone without requiring actual contact between the operator and any portion of the machinery, the circuit of the type including an electrical power conditioner, a sensor connected to the conditioned power for activating a device operable to shut off the machinery, the switching circuit further comprising:
   a. an emitter means mounted on the machinery and emitting a broadly diffused light signal outside the visual spectrum from the machinery into an operating zone adjacent the machinery where the operator's hand is to be positioned during operation of the machinery, said emitted light signal continuously reflected by the operator's hand when the hand is positioned in the operating zone;
   b. a modulator means connected to said emitter means modulating said emitted light signal;
   c. detector means mounted on the machinery substantially adjacent said emitter means and mated electrically therewith for receiving and detecting only said modulated reflected, emitted light signal;
   d. synchronizer means associated with said emitter means and said detector means for synchronizing said emitted light signal and said reflected, emitted light signal as received by said detector means;
   e. non-surrounding barrier means made of radiation impervious material disposed between said emitter means and said detector means and terminating adjacent the operating zone acting only to prevent the detection of non-reflected signals; and
   f. control means continuously responsive to the presence of a reflected signal for keeping the power machinery active and responsive to the lack of a reflected signal for deactivating the power machinery.

2. The switching circuit of claim 1, wherein the power machinery includes an internal combustion engine power source of the type including a condenser coil and wherein the switching circuit is inserted in series between the condenser coil and the engine ground.

3. The switching circuit of claim 1, wherein the power machinery includes at least one handle adapted to be covered by the hand of the operator when operating the power machinery, and wherein an emitter means and a detector means are located in each of said handles.

4. The switching circuit of claim 3, wherein a reflected, emitted signal must be received by a detector means before said control circuit is operative for keeping the power machinery active.

5. The switching circuit of claim 1, wherein the power conditioner produces an isolated voltage and wherein the control means further comprises:
   a logic circuit responding to the level of said isolated voltage; and
   b. control means associated with the logic circuit and responding to a change in level of the isolated voltage for keeping active or deactivating said power machinery.

6. The switching circuit of claim 5, further including a relay device responsive to said control means and connected to said power machinery for keeping active and deactivating the power machinery in response to a change in level of the isolated voltage.

7. The switching circuit of claims 6, wherein the power machinery includes an internal combustion engine power source of the type including a condenser coil and wherein the relay device is inserted in series between the condenser coil and the engine ground.

8. The switching circuit of claim 2, wherein the internal combustion engine procedures an unregulated source of electrical power and wherein said control means further includes conditioning means for conditioning the unregulated electrical power into an isolated, regulated voltage signal.

9. The switching circuit of claim 8, wherein said control means, emitter means, modulator means and detector means are responsive to the isolated, regulated voltage signal.

10. The switching circuit of claim 1, wherein the emitter means is an infra red light emitting diode device.

11. The switching circuit of claim 2, further including an operable power take off switch in series with the condenser coil, the switching circuit and the engine ground.

12. The switching circuit of claim 2, further including a master switch in parallel with the switching circuit.

13. An engine cut-off switching circuit for controlling power machinery, including an internal combustion engine power source of the type including a condenser coil and wherein the switching circuit is inserted in series between the condenser coil and the engine ground the circuit sensing the presence of an operator's hand in the proximity of an operating zone without requiring actual contact between the operator and any portion of the machinery, the circuit of the type including an electrical power conditioner, a sensor connected to the conditioned power for activating a device operable to shut off the machinery, the switching circuit further comprising;
   a. a light emitting diode mounted on the machinery and emitting a broadly diffused light signal outside the visual spectrum from the machinery into an operating zone adjacent the machinery where the operator's hand is to be positioned during operation of the machinery, said emitted light signal continuously reflected by the operator's hand when the hand is positioned in the operating zone;
   b. an optical light detector mounted on the machinery substantially adjacent said diode and electrically mated therewith for receiving and detecting only said reflected, emitted light signal;
   c. synchronizer means associated with said diode and said detector for synchronizing said emitted light signal and said reflected, emitted light signal as received by said detector;
   d. non-surrounding barrier means made of radiation impervious material disposed between said diode and said detector and terminating adjacent the operating zone acting only to prevent the detection of non-reflected signals; and
   e. control means continuously responsive to the presence of a reflected signal for keeping active the power machinery and responsive to the lack of a reflected signal for deactivating the power machinery.

14. The engine cut-off switching circuit of claim 13, wherein the power machinery includes a handle or multiple handles adapted to be covered by the hand of the operator when operating the power machinery, and wherein an emitter means and a detector means are located in each of said handles.

15. The engine cut-off switching circuit of claim 14, further including a relay device responsive to said control means and connected to said power machinery for keeping active and deactivating the power machinery in response to a change in level of the isolated voltage.

16. The engine cut-off switching circuit of claim 15, wherein the internal combustion engine produces an unregulated source of electrical power and wherein said control means further includes conditioning means for conditioning the unregulated electrical power into an isolated, regulated voltage signal.

17. The engine cut-off switching circuit of claim 16, wherein said control means, light emitting diode and said optical light detector are responsive to the isolated, regulated voltage signal.

* * * * *

UNITED STATES PATENT AND TRADEMARK OFFICE
CERTIFICATE OF CORRECTION

PATENT NO. : 5,397,890
DATED : March 14, 1995
INVENTOR(S) : Robert A. Schueler, Stuart J. Schueler It is certified that error appears in the above-indentified patent and that said Letters Patent is hereby corrected as shown below:

| | |
|---|---|
| Claim 5, Col. 7, L58: | Insert ---a.--- at beginning of paragraph |
| Claim 8, Col. 8, L7: | Delete "procedures" and insert therefor ---produces--- |

Signed and Sealed this

Fifth Day of September, 1995

Attest:

BRUCE LEHMAN

*Attesting Officer*      *Commissioner of Patents and Trademarks*